US005496597A

United States Patent [19]

Soininen et al.

[11] Patent Number: 5,496,597

[45] Date of Patent: Mar. 5, 1996

[54] METHOD FOR PREPARING A MULTILAYER STRUCTURE FOR ELECTROLUMINESCENT COMPONENTS

[75] Inventors: Erkki Soininen; Marja Leppänen, both of Espoo, Finland

[73] Assignee: Planar International Ltd., Espoo, Finland

[21] Appl. No.: 277,818

[22] Filed: Jul. 20, 1994

[30] Foreign Application Priority Data

Jul. 20, 1993 [FI] Finland .................................... 933278

[51] Int. Cl.$^6$ ............................ C23C 16/48; B05D 5/06; B05D 5/12

[52] U.S. Cl. ............................ 427/584; 427/66; 427/70; 427/126.3

[58] Field of Search ............................ 427/584, 64, 66, 427/69, 70, 126.3, 255.3

[56] References Cited

U.S. PATENT DOCUMENTS

| | | | |
|---|---|---|---|
| 4,058,430 | 11/1977 | Suntola et al. . | |
| 4,389,973 | 6/1983 | Suntola et al. . | |
| 4,552,782 | 11/1985 | Cattell et al. | 427/70 |
| 4,804,558 | 2/1989 | Saitoh et al. | 427/70 |
| 4,877,994 | 10/1989 | Fuyama et al. | 427/70 |
| 5,100,693 | 3/1992 | Eisch et al. | 427/126.3 |
| 5,156,885 | 10/1992 | Budd | 427/70 |
| 5,266,355 | 11/1993 | Wernberg et al. | 427/126.3 |
| 5,280,012 | 1/1994 | Kirlin et al. | 427/126.3 |
| 5,281,447 | 1/1994 | Brady et al. | 427/126.3 |
| 5,286,517 | 2/1994 | Kahng et al. | 427/70 |

OTHER PUBLICATIONS

"The Role of Chemical Vapor Deposition in the Fabrication of High Field Electroluminescent Displays," A Saunders et al., pp. 210–217, vol. 38, Springer Proceedings in Physics. 1989 (No month).

"A Full–Color Thin–Film Electroluminescent Device with Two Stacked Substrates and Color Filters", Shosaku Tanaka et al., SID 87 Digest, pp. 234–237 1987 no month.

"Multicolor TFEL Display Panel with a Double–Heterointerface–Structured Active Layer", T. Nire et al., ISID 92 Digest, pp. 352–355 1992 (no month).

"Red and Blue Electroluminescence in Alkaline–Earth Sulfide Thin–Film Devices", Shosaku Tanaka et al., SID, vol. 28/1, 1987, pp. 21–25 (no month).

"ZNS:MN/SRS:CE Multilayer Devices for Full–Color EL Applications", R. H. Mauch et al., SID 93 Digest, pp. 769–772 1993 no month.

"Oxygen Contamination in SRS:CE Thin–Film Electroluminescent Devices", Kenji Okamoto et al., Japanese Journal of Applied Physics, vol. 27, No. 10, Oct. 1988, pp. L1923–L1925.

"Bright–Blue Electroluminescence and Hysteresis Behavior in SRS:CECL$_3$ Thin Films", Bunjiro Tsujiyama et al., SID 86 Digest, pp. 37–40 1986 no month.

"Growth and Characterization of Aluminium Oxide Thin Films Deposited from Various Source Materials by Atomic Layer Epitaxy an Chemical Vapor Deposition Processes", L. Hiltunen et al., Materials Chemistry and Physics, 28 (1991), pp. 379–388 no month.

(List continued on next page.)

*Primary Examiner*—Marianne Padgett
*Attorney, Agent, or Firm*—Lowe, Price, LeBlanc & Becker

[57] ABSTRACT

The present publication discloses a method for fabricating a multilayer alkaline-earth sulfide-metal oxide structure particularly suited for use in electroluminescent components. According to the method, a multilayer structure comprising at least one phosphor layer and at least one dielectric layer is formed onto a suitable substrate. The phosphor layer comprises at least one alkaline-earth sulfide and the dielectric layer at least one metal oxide. At least one of the dielectric layers is deposited by means of surface reactions directly onto the alkaline-earth sulfide layer(s). The invention is based on depositing the metal oxide dielectric layer by using as the precursor a organometal complex not involving compounds which could react in a deleterious manner with the alkaline-earth sulfide layer. This approach results in an EL component structure of longer life than those of the prior art.

25 Claims, 2 Drawing Sheets

OTHER PUBLICATIONS

Figure 1:
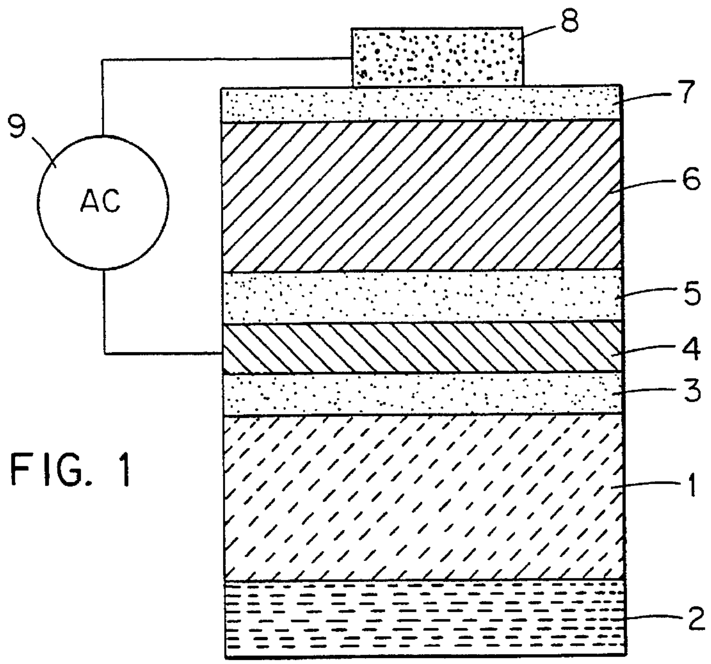

"Acta Polytechnica Scandinavica", Chemical Technology and Metallurgy Series No. 195, 1st International Symposium on Atomic Layer Epitaxy, M. Leskela et al., 1990, pp. 193–200 no month.

"Metal Alkoxides as Precursors for Electronic and Ceramic Materials", Donald Bradley, 1989 American Chemical Society, Chem. Rev. 1989, 89, pp. 1317–1322 no month.

"Titanium Isopropoxide as a Precursor in Atomic Layer Epitaxy of Titanium Dioxide Thin Films", Mikko Ritala et al. no date.

FIG. 3a
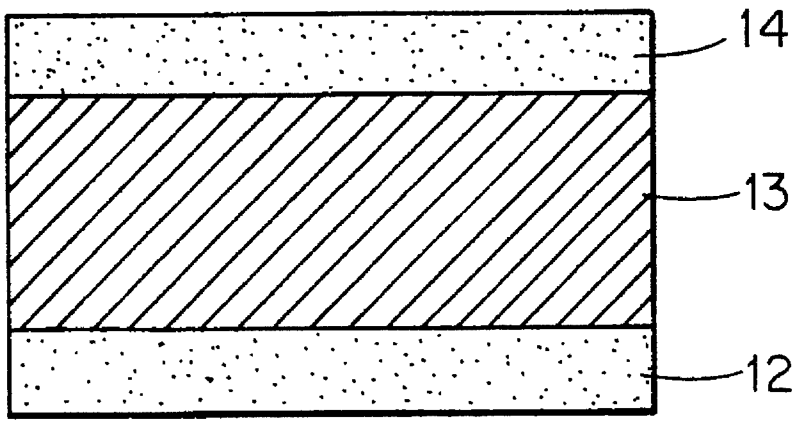
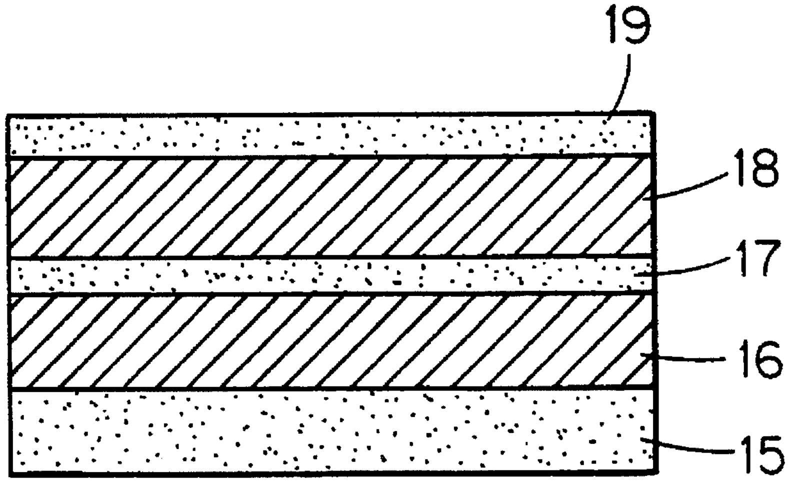
FIG. 3b

METHOD FOR PREPARING A MULTILAYER STRUCTURE FOR ELECTROLUMINESCENT COMPONENTS

The present invention is related to a method in accordance with the preamble of claim 1 for preparing a multilayer alkaline-earth sulfide-metal oxide structure particularly suited for use in electroluminescent components.

According to the method, a multilayer structure comprising at least one phosphor layer and at least one dielectric layer is deposited onto a suitable substrate by means of surface reactions. The phosphor layer comprises at least one alkaline-earth metal sulfide and the dielectric layer at least one metal oxide. Further according to the method, at least one of the dielectric layers is deposited directly onto the alkaline-earth sulfide layer.

Electroluminescent displays realized by means of thin-film techniques are conventionally based on a planar sandwich dielectric structure in which the phosphor layer is situated between two dielectric layers. The phosphor layer is formed from at least one host matrix material which is doped with at least one activator capable of emitting light in the range of visible light. The amount of different phosphor materials is wide: e.g., red is emitted by CaS:Eu and ZnS:Sm, green by ZnS:Tb, blue-green by SrS:Ce, blue by $SrGa_2S_4$:Ce, yellow-orange by ZnS:Mn, and white by SrS:Pr and SrS:Ce,Eu. The goal of developing white-light emitting phosphors bears a particular significance, because a structure based on a white-light emitting phosphor offers the possibility of constructing an easy-to-produce full-color display using three color filters [S. Tanaka, Y. Mikami, J. Nishiura, S. Ohsio, H. Yoshiyama and H. Kobayashi, Society of Information Display Symposium 1987, Digest of Technical Papers, New Orleans, 1987, p. 237]. Wideband light with an almost white color is emitted by a phosphor which is comprised of superimposed ZnS:Mn and SrS:Ce layers [T. Nire, A. Matsuno, F. Wada, K. Fuchiwaki and A. Miyakoshi, Society of Information Display Symposium 1992, Digest of Technical Papers, Boston, 1992, p. 352. R. H. Mauch et. al, Society of Information Display Symposium 1993, Digest of Technical Papers, 1993].

The purpose of dielectric layers sandwiching the phosphor layer is to provide a barrier to the current flow in the phosphor layer, to protect the phosphor layer both mechanically and chemically, and to provide advantageous interfaces between the phosphor and dielectric layers in terms of electron charge distributions. The dielectric layers are advantageously formed by oxides, e.g., $Y_2O_3$, $Al_xTi_yO_z$, $SiO_2$ and $Ta_2O_5$; by nitrides, e.g., $Si_3N_4$ and AlN; oxynitrides, e.g., SiAlON; or ferroelectric oxides, e.g., $BaTiO_3$, $PbTiO_3$ and $Sr(Zr,Ti)O_3$. Also the dielectric isolation is often formed by depositing different kinds of dielectric layers on each other in order to optimize the requirements set for the phosphor-dielectric interface on one hand, and on the other hand, those set for the capacitive properties of the dielectric layer.

EL display components are conventionally fabricated by deposition techniques based on sputtering, vacuum evaporation and chemical gas-phase methods.

The present invention is related to preparing a multilayer thin-film structure by means of reactive deposition techniques. In this context, reactive deposition techniques must be understood to refer to methods in which the layer to be prepared is formed when the initial reactants undergo chemical reactions with the surface of the substrate or a layer already formed onto the substrate. In the context of the present invention, such reactions are called surface reactions. E.g., the following deposition methods are reactive: chemical gas-phase methods (CVD) including organometal gas-phase deposition MOVPE (or MOCVD) and atomic layer epitaxy (ALE), and other reactive methods such as the spray techniques (spray hydrolysis, spray pyrolysis), reactive sputtering, and in some cases, such vacuum evaporation methods as the Closed-Space method, molecular beam epitaxial deposition, Multi Source Deposition and the hot-wall deposition method. When reacting with the substrate surface, the initial reactant provides an atom, ion, compound or a precursor thereof to form a part of a multilayer structure.

In sputtering and conventional vacuum evaporation deposition methods the initial reactants are often a compound identical to that of the layer being deposited, whereby no chemical reactions occur on the substrate surface, thus making such methods different from the reactive deposition methods disclosed in the present invention.

When using reactive methods for depositing multilayer structures, a danger exists that the initial reactants introduced for one process step may react in an undesirable manner with the layer deposited during the preceding process step. This risk restricts the selection of materials usable in reactive deposition methods.

The host matrix material in the phosphor layer is most commonly one of the metal sulfides listed above. In their use, particularly the function of EL display components based on alkaline-earth sulfides (MgS, CaS, SrS, BaS) has proven sensitive to the effect of oxygen and humidity [cf. E.g., K. Okamoto and K. Nanaoka, Jpn. J. Appl. Phys. 27, $L_{1923,\ 1988}$. W. A. Barrow, R. E. Coovert and C. N. King, Society of Information Display Symposium 1984, Digest of Technical Papers, San Francisco, 1984, p. 249]. It has been proposed that the use of oxide dielectric layers in combination with alkaline-earth sulfide based phosphor materials leads to reactions of the phosphor material with the oxides and thus causes inferior stability of such EL display components. To avoid this, barrier layers of ZnS have been deposited between the phosphor material layers and the metal oxide layers [cf. e.g., B. Tsujiyama, Y. Tamura, J. Ohwaki and H. Kozawaguchi, Society of Information Display Symposium 1986, Digest of Technical Papers, San Diego, 1986, p. 37. S. Tanaka, H. Deguchi, Y. Mikami, M. Shiiki and H. Kobayashi, Society of Information Display Symposium 1987, Digest of Technical Papers, New Orleans, 1987, p. 21]. EL display components have so far been fabricated using the Atomic Layer Epitaxy (ALE) method, which belongs to the chemical gas-phase deposition techniques, only with a metal oxide-metal sulfide-metal oxide multilayer structure. As alkaline-earth sulfides are decomposed by humidity, a particular goal has been to obviate the use of water as an oxidant in the deposition process step of metal oxide dielectric layers in the ALE method [cf. M. Leskelä, L. Niinistö, E. Nykänen, P. Soininen and M. Tiitta, 1st International Symposium on Atomic Layer Epitaxy, Acta Polytechnica Scandinavica, Chem. Techn. and Metallurgy Series No. 195, Helsinki, 1990, p. 193. L. Hiltunen, H. Kattelus, M. Leskelä, M. Mäkelä, L. Niinistö, E. Nykänen, P. Soininen and M. Tiitta, Materials Chemistry and Physics 28, 379, 1991].

The ALE method has so far been used for deposition fabrication of entire EL components only by way of using metal chlorides as the metal precursors for the metal oxides thus formed. However, it has been noted that when metal oxides are deposited from chlorine-containing compounds, e.g., aluminum oxide onto alkaline-earth sulfides, the crystalline structure may remain contaminated by chlorine [L. Hiltunen, H. Kattelus, M. Leskelä, M. Mäkelä, L. Niinistö, E. Nykänen, P. Soininen and M. Tiitta, Materials Chemistry and Physics 28, 379, 1991]. In fact, the existence of chlorine residues in metal oxide thin-film layers deposited in the above-mentioned manner is well recognized in the art.

The present invention is based on the discovery that an EL display element based on a metal oxide-alkaline earth sulfide-metal oxide multilayer structure is not so much disadvantaged by said chlorine residues or the oxygen of the metal oxide, but rather, by the undesirable reactions between the metal chlorides and the alkaline-earth sulfides. Precursor-originating residual chlorine which occurs bonded with the metal species or hydrogen is easily reacted with the metal species of the alkaline-earth sulfides thus forming deleterious compounds which impair the performance of the EL display component and particularly affect the stability of the component.

This discovery is next described in greater detail:

When aluminum oxide is deposited by means of the ALE method from aluminum chloride and water, the reaction occurs as follows:

$$2\ AlCl_3(s,g)+H_2O(g)\rightarrow Al_2O_3(s)+6\ HCl(g). \quad (1)$$

The deposition temperature typically is in the range 400°–500° C. When an $Al_2O_3$ layer is deposited in the above-described manner onto an SrS:Ce layer, significant amounts of chlorine remain trapped close to the interface between the layers. This has been evidenced by x-ray fluorescence: The number of detected Cl pulses in SrS:Ce+$Al_2O_3$ structures was found to be more than five-fold compared with chlorine residues detected in $Al_2O_3$ layers deposited directly on a plain glass substrate. The SrS:Ce layer was deposited from chlorine-free precursors, and no Cl pulses were detected in x-ray fluorescence measurements on an SrS:Ce layer prior to coating the layer with the dielectric. The x-ray diffraction results indicate that at least a fraction of the chlorine occurs as crystalline strontium chlorides $SrCl_2$. This means that the $AlCl_3$ or its decomposition results are reacted with the SrS. Two likely reactions with their Gibbs free energy changes in the temperature range 300°–500° C. are:

$$3\ SrS(s)+2\ AlCl_3(g)\rightarrow 3\ SrCl_2(s)+Al_2S_3(s,g)\ \Delta G=-144—-119\ \text{kJ/mol} \quad (2)$$

$$SrS(s)+2\ HCl(g)\rightarrow SrCl_2(s)+H_2S(g)\ \Delta G=-259—-228\ \text{k/mol} \quad (3)$$

The Gibbs free energies are strongly negative indicating that the reactions take place with a high probability from the left to the right. The hydrochloric acid HCl occurring in reaction (3) is formed in, e.g., $AlCl_3$ source from water residues, and via reaction (1), on the surface of the layer being deposited.

The observation can be generalized as follows:

When a metal oxide ($M_mO_n$) is deposited starting from a metal halide ($MX_{2n/m}$) and water, the basic reaction is:

$$m\ MX_{2n/m}+n\ H_2O(g)\rightarrow M_mO_n(s)+2n\ HX(g). \quad (4)$$

When the metal oxide $M_mO_n$ is deposited onto an alkaline-earth sulfide AS, the metal halide $MX_{2n/m}$ may, however, react via an alternative, competing reaction with the alkaline-earth sulfide AS in the manner of reaction (2). On the other hand, the hydrogen halide HX resulting from reaction (4) may react with the underlying alkaline-earth sulfide layer AS thus forming an alkaline-earth halide $AX_2$ in the same manner as expressed by reaction formula (3). In both cases the AS—$M_mO_n$ interface may trap some amount of the undesirable alkaline-earth halide $AX_2$ which could deleteriously affect the performance of the component being fabricated.

In the above compositions, 2n/m is the most common oxidization number of the metal, whereby the most common binary oxide is $M_mO_n$, where M is a metal. Suitable metals are listed below by their oxidization number:

m=1, n=1: Be, Mg, Ca, Sr, Ba, Cr, Cu, Zn, Cd, Hg, Pb, Co m=2, n=3: Al, Ga, In, Tl, Bi, Sc, Y, La, Pr, Eu, Sb, Nd, Er, Sm, Gd, Dy, Tm, Tb, Yb, Pm, Ho, Lu m=2, n=1: Au, Ag m=1, n=2: Si, Ge, Ce, W, Th, Sn, Ti, Zr, Hf, m=2, n=5: Nb, Ta, V, m and n vary: Co, Rh, Ir, Fe, Ru, Os, Mn, Tc, Re, Mo, Ni, Pd, Pt From the above list of metals, the most important for electroluminescent component applications are Al, Ti, Y, Sm, Si, Ta, Pb, Ba, Nb, Sr, Zr, Mn, Hf, La, Pr and possibly Mg, Zn, Te, Sn, Th, W and Bi.

It has been experimentally evidenced that $Al_2O_3$ and $TiO_2$can be deposited by the ALE method also from aluminum alkoxides ($Al(OPr)_3$, $Al(OEt)_3$) [L. Hiltunen, H. Kattelus, M. Leskelä, M. Mäkelä, L. Niinistö, E. Nykänen, P. Soininen and M. Tiitta, Materials Chemistry and Physics 28, 379, 1991] or from titanium alkoxides ($Ti(OPr)_3$) [M. Ritala, M. Leskelä, L. Niinistö and P. Haussalo, to be published]. E.g., when $AlCl_3$ in the deposition (1) of $Al_2O_3$ is replaced by aluminum (iso)propoxide $Al(OPr)_3$ [$=Al(OCH(CH_3)_2)_3$] belonging to aluminum alkoxides, the reactions may be based on the hydrolysis of $Al(OPr)_3$to an alcohol and aluminum hydroxide, and further via subsequent dehydration, to aluminum oxide and water, whereby the reaction may proceed as follows:

$$2\ Al(OCH(CH(CH_3)_2)_3(g)+6\ H_2O(g)\rightarrow Al_2O_3(s)+6\ (CH_3)_2CHOH(g)+3H_2O(g). \quad (5)$$

Then, isopropanol and water would be released in the reaction.

A. Saunders and A. Vecht report in publication Springer Proceedings in Physics, Vol. 38, p. 210, the deposition of the different layers in electroluminescent structures by the CVD method and state that the method offers a wide application potential. The method was successful in depositing ZnS:Mn and dielectric layers from a plurality of volatile compounds such as carbamates.

It is an object of the present invention to achieve a method suited to preparing a metal oxide layer onto an alkaline-earth sulfide layer in a manner that maximizes the luminance and stability of the EL component structure. According to the invention, the goal is attained by using precursors which do not react with the alkaline-earth sulfide so as to form deleterious compounds.

An unexpected discovery has been made in conjunction with the present invention that when a dielectric layer comprised of a metal oxide is deposited onto a phosphor layer containing an alkaline-earth sulfide, whereby the precursor for said dielectric layer is an organometal complex containing at least one metal atom and at least one organic ligand bonded to said at least one metal atom via an oxygen atom, an EL structure comprised of an alkaline-earth sulfide and a metal oxide is obtained which is characterized by an extreme stability with a low luminance decay rate vs. operating hours. As is evidenced by Example 1 to be described later, the luminance of a comparative structure deposited using a halogen compound (aluminum chloride) decays quite rapidly to a low level, while the luminance of a structure deposited using the method according to the invention stays better than 80% of the luminance of a burned-in virgin structure even after 800 operating hours.

By virtue of the invention, the prepared alkaline-earth sulfide layer need not be isolated by separate dielectric barrier layers, but rather, the phosphor layer can be directly covered by a dielectric layer formed from a metal oxide.

Further, the invention makes it now possible to fabricate multilayer electroluminescent components possessing the above-mentioned advantageous properties and which comprise at least two phosphor layers deposited on a substrate of which layers at least one contains an alkaline-earth sulfide. By combining different phosphor layers and dielectric layers, multilayer structures with desired properties can be made. E.g., a prefabricated substrate onto which a multilayer structure is formed using the method according to the invention, may simply comprise a base substrate, a phosphor layer deposited on it, and a dielectric layer, or alternatively, a combination of different phosphor layers and dielectric layers. The layers of the prefabricated substrate can also be formed by methods different from that used in the implementation of the invention. Correspondingly, a multilayer structure fabricated by the method according to the invention can be further complemented by different kinds of multilayer structures formed by the method according to the invention, or alternatively, any other method. The topmost layers of the structures deposited onto the substrate are generally formed by a transparent or opaque conductor pattern and a dielectric.

More specifically, the method according to the invention is characterized by what is stated in the characterizing part of claim 1.

In the context of the present patent application, the term "metal complex" refers to a compound containing a metal species and an organic residue bonded to the metal species via a chemical or physical bond. The metal species comprises a metal ion, atom or molecule. Metal complexes may also usually be defined as compounds formed through combination of at least one organic group with at least one metal ion (or atom) or molecule. The metal complex may also incorporate a number of metal species whose configuration may be identical or different and which may stem from precursor compounds of different elemental metals.

The organic residue of the metal complex is also called a ligand.

In the context of the present patent application, the term "metal" covers elements of both metal and semimetal character. Examples of these are listed above.

The term "evaporation" is used to refer to the phase-transition of a liquid or solid substance to a vapor. Consequently, the term covers both evaporation and sublimation.

Further, the term "luminance" is used to refer to the photometric brightness of the electroluminescent component. Luminance measurements are carried out by feeding the component with an AC voltage having an amplitude that exceeds by at least 30 V the voltage at which the luminance of the burned-in component is 1 cd/$m^2$. A burned-in component is such as has been driven for 6–10 h by a 1 kHz AC voltage having an amplitude that exceeds by at least 30 V the voltage at which the luminance of the virgin component is 1 cd/$m^2$. The luminances of the burned-in component and the component being tested are measured at the same drive voltage. Burn-in is conventionally used as a part of the manufacturing process of EL components in order to stabilize the components.

The "effective test time" of the component refers to the actual test time convened to a standard test frequency of 60 Hz. The effective test time is computed from the formula:

$$\text{Effective test time} = \text{Actual test time after burn-in} \times \text{Test frequency} / 60\ \text{Hz}$$

During the burn-in period the component is fed by an AC voltage having a frequency that is greater than 60 Hz and amplitude at least 30 V greater than the voltage at which the luminance of the burned-in component is 1 cd/$m^2$. The component is not cooled below 20° C.

Thus, e.g., a 96-h test after burn-in at 500 Hz frequency corresponds to an effective test time of 800 h. The luminance of a practical display component may not decay in excess of 20% during such a test.

According to an advantageous embodiment of the invention, the dielectric layer is deposited onto the phosphor layer from the gas phase of a organometal complex precursor having the composition of the general formula $ML_n$, where M is the metal of the metal oxide in the dielectric layer, L is an organic ligand bonded to the metal via an oxygen atom, and n is the coordination number 1–5 of the metal species.

According to another advantageous embodiment of the invention, the precursor for the metal oxide is a vaporizable organometal complex having the composition of the general formula $M(OR)_n$, where M and n are the same as above and R is an alkyl group of 1–10 carbons.

The deposition of oxide layers by the method according to present invention is also possible using metal complex precursors of the above-described type having two cations.

Advantageously, M is one of the following metals: Al, Ti, Y, Sm, Si, Ta, Pb, Ba, Nb, Sr, Zr, Mn, Hf, La, Pr, Mg, Zn, Te, Sn, Th, W or Bi. Particularly advantageously the metal oxide of the dielectric layer is aluminum oxide, titanium oxide, hafnium oxide, tantalum oxide, niobium oxide, zirconium oxide, yttrium oxide, samarium oxide, lanthanum oxide, silicon oxide, or a mutual combination thereof or with oxides or oxynitrides of silicon, or barium titanate, barium tantalate, strontium titanate, lead titanate, lead niobate or $Sr(Zr,Ti)O_3$.

Oxides suited for use as the dielectric layer are listed below:

| | |
|---|---|
| $Y_2O_3$ | $Nb_2O_5$ |
| $Sm_2O_3$ | $HfO_2$ |
| $Al_2O_3$ | $ZrO_2$ |
| $SiO_2$ | $La_2O_3$ |
| $Ta_2O_5$ | $Bi_2O_3$ |
| $PbTiO_3$ | $ThO_2$ |
| $BaTa_2O_6$ | $SnO_2$ |
| $PbNbO_6$ | PbO |
| $SrTiO_3$ | SrO |
| $Sr(Zr,Ti)O_3$ | BaO |
| $BaTiO_3$ | $WO_2$ |
| $TiO_2$ | |
| $PrMnO_3$ | |
| $MnTiO_3$, $PbTiO_3$ | |
| $PbTeO_3$. | |

The dielectric layer can also be a combination of different oxides:

$Ta_2O_5/Si_2$ $Al_2O_3/Ta_2O_5$ $Al_2O_3/TiO_2$ $Ta_2O_5/Y_2O_3$ $Ta_2O_5/Si_3N_4$

SiON/ATO

Correspondingly, the alkaline-earth sulfide layer advantageously contains a sulfide of Ca, Mg, Sr and/or Ba. Particularly advantageously the alkaline-earth sulfide is doped with at least one of the following dopants: cerium, manganese, europium, terbium, thulium, praseodymium, samarium, gadolinium, holmium, ytterbium, erbium, tin, copper, bromine, iodine, lithium, sodium, potassium, phosphorus, chlorine, fluorine or lead.

Other advantageous properties of the invention are described below and defined in the annexed claims.

When the deposition of the metal oxide layer is performed using organometal complexes with a general composition of $ML_n$ as the precursor instead of a metal halide, unwanted reactions with the metal sulfide are avoided. The ligands L can be alkoxides (e.g., methoxide, ethoxide, propoxide, butoxide and pentoxide) or β-diketonates (e.g., TMHD and acetylacetonate) and the metal M can be any from the above-given list. The generalized form of reaction (5) for, e.g., the alkoxides of metals with a valency of 4 is:

$$M(OR)_4(g)+2\ H_2O(g)\rightarrow MO_2(s)+4\ ROH(g) \quad (6)$$

where R is an alkyl group of 1–10 carbons.

In reactions (4)–(6) water can be replaced by other oxidants such as alcohols, particularly aliphatic alcohols (methanol, ethanol, propanol, butanol) or glycerol, oxygen, hydrogen peroxide, ozone or nitrous oxide. However, when using metal halides, there still remains the risk of the metal halide reacting with the underlying alkaline-earth sulfide or that the formed hydrogen halide reacts with the metal sulfide in the manner described above. By contrast, when using any of the above-listed organometal complex compounds $ML_n$, such undesirable reactions are avoided.

Metal alkoxides can undergo a direct thermal decomposition to metal oxides [D. C. Bradley, Chem. Rev. 89, 1317, 1989]. Here, both water and alkenes can be released. Similarly as with the use separate oxidants, by depositing the metal oxide through thermal decomposition of a metal alkoxide, undesirable reactions at the interface between the alkaline-earth sulfide and the metal oxide layers are avoided. Decomposition of metal alkoxides is also possible with the help of light.

The metal sulfide mentioned in the above discussion may be deposited by means of any suitable method.

To achieve a white phosphor, for instance, it is advantageous to prepare multilayer structures are fabricated by alternating deposition of metal sulfides $M_m$,$S_n$ and $M1_{m1}S_{n1}$. Such combination phosphors could be, e.g., SrS:Ce—ZnS:Mn or CaS:Eu— ZnS:Tm. Similarly as in an alkaline-earth sulfide-metal oxide structure, the use of halides could result in the occurrence of alternative, competing reactions in the interface between the two metal sulfide layers, particularly if the first one of them in the deposition sequence is an alkaline-earth sulfide. When a metal sulfide $M_mS_n$ is deposited onto an alkaline-earth sulfide AS, the metal halide $MX_{2n/m}$ may undergo an alternative reaction with the alkaline-earth sulfide AS. As an alternative, the hydrogen halide HX formed in the reaction may react with the underlying alkaline-earth sulfide layer AS thus forming a metal halide $AX_2$. In both cases an undesirable metal halide $AX_2$ may remain in the AX—$M_mS_n$ interface which may affect in a deleterious manner to the performance of the component being fabricated. By virtue of depositing a metal oxide layer from metal complex precursors $ML_n$ between the two metal sulfide layers, the formation of the deleterious metal halides in the interfaces is avoided.

In certain cases it may be advantageous to divide a single, thick phosphor layer into a plurality of thinner layers dielectrically isolated from each other. This may have a positive effect on the luminance of the EL component. Such structures can be fabricated by using metal complex precursors $ML_n$ for depositing the metal oxides acting as the intermediate dielectric layers.

In this invention, multilayer structures of particular benefit are considered to be formed by combinations of manganese-doped zinc sulfide layers and cerium-doped strontium sulfide layers. Accordingly, an advantageous multilayer structure comprises at least the following layers in the order: manganese doped zinc sulfide—cerium doped strontium sulfide—metal oxide. The first part to be deposited of the metal oxide layer may comprise, e.g., an aluminum oxide layer formed starting from alkoxide precursor. Correspondingly, another advantageous multilayer structure may comprise the following layers: manganese-doped zinc sulfide layer, cerium-doped strontium sulfide layer, metal oxide layer, and cerium-doped strontium sulfide layer. A third advantageous multilayer structure comprises the following layers: cerium-doped strontium sulfide layer, metal oxide layer and manganese-doped zinc sulfide layer. Also in these embodiments the metal oxide layers are formed using an aluminum compound precursor.

The invention provides significant benefits.

Chemical gas-phase methods and atomic layer epitaxy in particular produce layers of extremely high quality for electroluminescent components, which is evidenced as the high luminance of such EL display components. Deposition by these methods can be carried out at relatively low temperatures, whereby the requirements set for the substrate materials are relaxed offering lower production cost. A third significant benefit of the ALE method is that the entire combination dielectric-phosphor-dielectric layer can be deposited during a single process step (performed during a single pump-down in situ).

Display components fabricated by the ALE method, as well as those manufactured by any other method, deteriorate during use so that the maximum luminance values of driven pixels decay and nondriven pixels start to exhibit luminescence. When the metal oxide layer is deposited onto a phosphor based on an alkaline-earth sulfide host by the method according to the present invention, the time-dependent decay of such display components is significantly retarded and the life of the component extended.

Full-color displays require a novel blue phosphor for which one of the most promising is SrS:Ce. In prior-art EL components with a dielectric-SrS:Ce-dielectric structure deposited by the ALE method, the luminance of the component decayed after a few hours of use to an unusably low value. An important reason to the rapid decay is plausibly traceable to the formation of deleterious chlorine compounds in the interface between the phosphor layer and the dielectric layer, which can be avoided by virtue of the present invention. The present method is suited to depositing a dielectric onto the SrS:Ce layer in a manner resulting in one of the highest-luminance blue EL structures with an additional benefit of no significant luminance decay.

The method makes it also possible to deposit other EL components based on an alkaline-earth sulfide-metal oxide structure using reactive deposition methods.

Phosphors emitting almost white light as is required for full-color displays can be deposited by virtue of the present method into multilayer structures using precursors which in the prior an were incompatible with reactive methods. This is attained by depositing barrier layers of a metal oxide between the phosphor layers.

The method makes it possible to interleave the phosphor with oxide layers which contribute beneficially to the luminance of the EL component.

Further, the method obviates the use of separate barrier layers in EL components between the alkaline-earth sulfide and metal oxide layers, thus offering a simpler deposition process of such components and avoiding the voltage drop over the barrier layer which conventionally sets extra requirements for the drive electronics.

Further, the metal oxide layers can be deposited at a significantly lower temperature, and the reagents as well as their residues from the reactions have a less corrosive nature than the chlorine compounds used in the prior-an.

Figure 2:
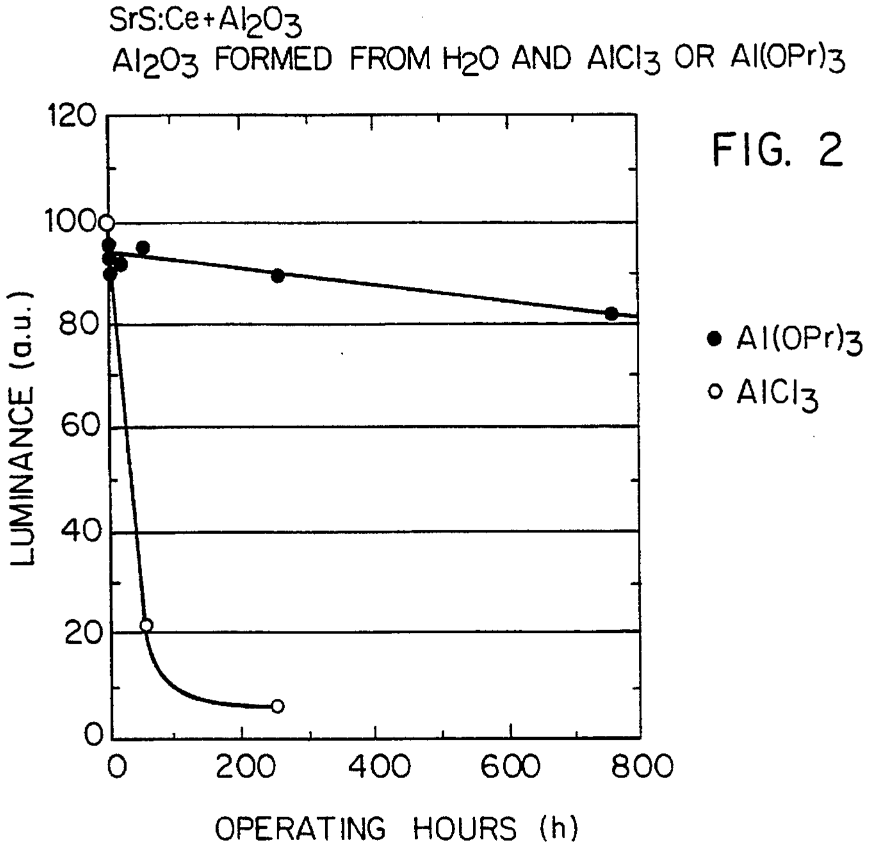

The invention is next described in greater detail with the help of annexed drawings and examples, in which drawings:

FIG. 1 is a diagrammatic representation of the structure of a thin-film electroluminescent component;

FIG. 2 is graph representing the luminance decay in EL structures based on the SrS:Ce phosphor. In these structures, the $Al_2O_3$ top dielectric was deposited using water and $AlCl_3$ or $Al(OPr)_3$, alternatively. The luminance decay tests of the structures were performed at 500 Hz, while the time axis in the diagram is scaled to operating hours at 60 Hz. The vertical axis is scaled to represent the measured test component luminance at constant drive voltage in per cent relative to the luminance of a virgin sample component.

FIG. 3*a* represents a conventional EL structure with dual dielectric layers.

FIG. 3*b* represents a conventional EL structure with triple dielectric layers.

With reference to FIG. 1, the different layers of the component are deposited onto a glass substrate 1. The first layer deposited onto the substrate 1 is a barrier layer 3 against ion diffusion, onto which a transparent ITO electrode layer 4 is deposited. The electrode layer 4 is covered by a dielectric layer 5 of aluminum-titanium oxide, next the dielectric layer 5 is covered by an SrS:Ce phosphor layer 6, onto which is deposited a second dielectric layer 7 of aluminum oxide, and finally a background electrode layer 8. The electrodes 4, 8 are connected to an AC drive voltage generator 9.

With reference to FIG. 3*a*, a dual-dielectric-layer structure is shown having a phosphor layer 13 of, e.g., SrS:Ce, deposited between a aluminum-titanium oxide dielectric layer 12 and an aluminum oxide dielectric layer 14. With reference to FIG. 3*b*, a corresponding triple-dielectric-layer structure is shown having two phosphor layers 16 and 18. The first dielectric layer 15 is of aluminum titanium oxide and the first phosphor layer 16 is of SrS:Ce. The second dielectric layer 17 is of aluminum oxide and the second phosphor layer 18 may be, e.g., of SrS:Ce or ZnS:Mn. The third dielectric layer 19 is again of aluminum oxide 19.

The structures shown in these diagrams and the materials cited therein must be understood to be representative cases of suitable combinations.

EXAMPLE 1

Deposition of $Al_2O_3$ onto SrS:Ce using aluminum isopropoxide and water as precursors in the ALE method Using an ALE reactor (U.S. Pat. No. 4,389,973) for deposition on suitable substrates such as glass plates having a 200 nm indium-tin oxide (ITO) layer deposited onto them by sputtering, EL structures according to FIG. 1 were fabricated so that the underlying $Al_xTi_yO$ dielectric layer was formed using the ALE method (described in greater detail in U.S. Pat. No. 4,058,430) in a conventional manner using $AlCl_3$, $TiCl_4$ and water as precursors, while the SrS:Ce layer was formed using β-diketonate-chelates (2,2,6,6-tetramethyl-3,5-heptanedionates) and hydrogen sulfide as precursor for the strontium and cerium. After the sulfide layer has been deposited, the temperature of the reaction chamber and thus also the temperature of the substrates was controlled to 390° C. The temperature was allowed to stabilize for approx. two hours in a pack of 28 substrates. Approx. 10 g aluminum isopropoxide was heated in a source oven to 130° C. The Al precursor was pulsed alternately with water into the reaction chamber over the substrates. The duration of the Al pulse was 1.0 s, followed by a pause of 0.8 s, during which the excess reagent was purged to the pumps. Subsequently, a water pulse of 1.2 s duration was introduced, again followed by a purging pause of 0.8 s. After repeating the pulse sequence 1800 times, an aluminum oxide layer of 200 nm thickness was formed onto the strontium sulfide layer. The reaction chamber pressure during the process was approx. 1.6 torr, while the source oven was maintained at approx. 2 torr. The deposited dual-dielectric-layer structure is shown in FIG. 3*a*.

A comparative sample for reference was fabricated by depositing an $Al_2O_3$ dielectric layer in a conventional manner using $AlCl_3$ as the precursor and water as the oxidant.

Onto both structures was evaporation deposited an Al electrode, to which an AC voltage was connected and the photometric brightness of emitted blue-green light was measured after at predetermined numbers of operating hours. The results are given in FIG. 2. It is shown that in components fabricated using $AlCl_3$ as the precursor, the luminance decays to below 10% from the test start value already after less than 200 operating hours, while a component fabricated using aluminum isopropoxide as the precursor exhibits a luminance over 80% of the test start value still after 800 operating hours. The test start values of both virgin components exhibited no significant difference.

Aluminum oxide was deposited onto SrS:Ce also from an $Al(OEt)_3$ precursor, and the stability of the EL structures thus fabricated was in the same order with those fabricated using $Al(OPr)_3$ as the precursor.

Next, an SrS:Ce phosphor layer and then an $Al_2O_3$ dielectric layer were deposited in the above-described manner onto substrates which already had a 200 nm thick Zn:Mn phosphor layer deposited onto an indium-tin oxide (ITO) conductor layer and an $Al_xTi_yO$ dielectric layer. Analogously, onto the above-described ITO—$Al_xTi_yO$—SrS:Ce$Al_2O_3$ structure was first deposited a ZnS:Mn phosphor layer and then an $Al_xTi_yO$ dielectric layer. In both cases the light emitted by the EL component was greenish-yellow and it could be filtered into all three basic colors: blue, red and green. The luminance of the component was found to stay at a level better than 80% from the test start value still after 800 operating hours.

EXAMPLE 2

Deposition of $TiO_2$ onto CaS:Eu using titanium isopropoxide as precursor for the titanium species Onto suitable substrates such as glass plates having a 200 nm indium-tin oxide (ITO) layer deposited onto them by sputtering and further having a 200 nm aluminum-titanium oxide (ATO) layer deposited on them, was deposited a 500 nm calcium sulfide layer by the atomic layer epitaxy method (U.S. Pat. No. 4,058,430). During the process the reaction chamber pressure was maintained at 1.3 torr. The glass plates acting as the substrates were maintained at 410° C. during the deposition of the CaS:Eu phosphor layer. After the desired thickness of the CaS layer was attained, the substrate temperature was lowered to 360° C. Titanium isopropoxide was introduced in pulses of 0.8 s duration into the reaction chamber from a precursor flask controlled to 30° C. Titanium isopropoxide decomposes thermally on the surface of the calcium sulfide layer forming titanium oxide and volatile decomposition products. Each reagent pulse of 0.8 s duration was followed by a pause of 1.0 s duration during which an inert gas was passed over the substrates to purge the volatile reaction products and the excess reagent to the pumps. After repeating the sequence of titanium isopropoxide pulsing 1200 times, a titanium oxide layer of 80 nm thickness was formed onto the CaS:Eu layer, which is sufficient to protect the calcium sulfide surface against zinc chloride. Next, terbium-doped zinc sulfide was deposited onto the CaS:Eu—$TiO_2$ structure by the ALE method using zinc chloride and hydrogen sulfide as precursors. This process yields a phosphor layer emitting red and green light.

In a corresponding manner, titanium oxide or zirconium oxide layers can be deposited using alkoxides $M(OR)_4$ of titanium and zirconium as precursors, where M is Ti or Zr, and R is the hydrocarbon chain of the alkoxide, such precursors including one of the the following compounds, for example.

$CH_3$
$C_2H_5$
$CH_3(CH_3)_3$
$CH_3(CH_2)_7$
$(CH_3)_2CH$
$(C_2H_5)_2CH$
$(C_3H_7)_2CH$
$(CH_3)_3C$
$C_2H_5(CH_3)_2C$
$CH_3(CH_2)_4$
$(CH_3)_2CH(CH_2)_2$
$(CH_3C_2H_5)CH{=}CH_2$
$(CH_3)_3C{=}CH_2$
$(C_2H_5)_2CH$
$(CH_3C_3H_7)CH$
$(CH_3C_3H_7)CH$
$(CH_3)2C_2H_5C$

Usable vapor pressure can be as low as 0.1 torr, and it is attained in the temperature range of 100°–220° C. for the above-listed compounds.

$Al_2O_3$, $HfO_2$ or $Ta_2O_5$ layers can be deposited in the above-described manner using the following liquid precursors (the temperature giving approx. 1 torr vapor pressure is given for each compound in brackets): Aluminum n-butoxide $Al(OC_4H_9)_3$ [245° C.], aluminum tertbutoxide $Al(OC(CH_3)_3$ [150° C.], aluminum n-propoxide $Al(O(CH_2)_2CH_3)$ [205° C.], hafnium-tertbutoxide $Hf(OC(CH_3)_3)_4$ [80° C.], tantalum ethoxide $Ta(OC_2H_5)_5$ or tantalum fluorethoxide $Ta(OCH_2CF_3)_5$.

$Al_2O_3$ or $HfO_2$ layers can be deposited in the above-described manner utilizing the high vapor pressure (approx. 0.1 torr) of the following solid or liquid precursors (suitable source oven temperatures for each precursor given in brackets): Aluminum ethoxide $Al(OC_2H_5)_3$ [140° C.], aluminum isopropoxide $Al((OCH(CH_3)_2)_3$ [130° C.], hafnium ethoxide $Hf(OC_2H_5)_4$ [180° C.], hafnium isopropoxide $Hf(OC_3H_7)_4$ [190° C.].

$Ta_2O_5$ or $Nb_2O_5$ layers can be deposited in the above-described manner using alkoxides $M(OR)_5$ of tantalum or niobium, where M is Ta or Nb, and R is the hydrocarbon chain of an alkoxide such as those listed below:

$CH_3$
$CH_2CH_3$
$(CH_2)_2CH_3$
$(CH_2)_3CH_3$
$(CH_2)_4CH_3$
$CH(CH_3)_2$
$C(CH_3)_3$
$CH(CH_2CH_3)$
$CHCH_3(CH_2)_2CH_3$
$(CH_3)_2CHCH_2CH_2$

The above-listed alkoxides attain a vapor pressure of approx. 0.1 torr in the temperature range of 60°–200° C.

Using the method described above, also silicon oxides SiO or $SiO_2$ can be deposited using such silicon alkoxides as precursors that are liquid at the room temperature and attain a sufficiently high vapor pressure in the temperature range of 30°–100° C. Suitable silicon alkoxides are silicon tetraethoxide $Si(OC_2H_5)_4$, silicon tetraphenoxide $Si(OC_6H_5)_4$, silicon tetrabutoxide $Si(OC_4H_9)_4$, silicon tetramethoxide $Si(OCH_3)_4$, silicon trimethylethoxide $Si(OC_2H_5(CH_3)_3)$, and silicon trimethoxyethyl $Si((OCH_3)_3C_2H_5)$.

Deposition of a metal oxide onto a metal sulfide is also successful using alkoxides containing two metal cations as precursors. A list of suitable alkoxides is given below with their applicable evaporation or sublimation temperatures at which the vapor pressure of the precursor is sufficiently high (0.1–0.5 torr) for the process.

| ($OPr^n$ = propoxide, $OPr^i$ = isopropoxide, OEt = ethoxide) | |
|---|---|
| $MgAl_2(OPr^n)_8$ | 135° C. |
| $Mg(Zr_2(OPr^i)_9)_2$ | 170° C. |
| $Mg(Zr_3OPr^i)_{14}$ | 170° C. |
| $Ca(Zr_2(OPr^i)_9)_2$ | 190° C. |
| $CaZr_3(OPr^i)_{14}$ | 145° C. |
| $Sr(Zr_2(OPr^i)_9)_2$ | 200° C. |
| $SrZr_3(OPr^i)_{14}$ | 180° C. |
| $Ba(Zr_2(OPr^i)_9)_2$ | 260° C. |
| $BaZr_3(OPr^i)_{14}$ | 190° C. |
| $ZrAl(OPr^i)_7$ | 160° C. |
| $ZrAl_2(OPr^i)_{10}$ | 170° C. |
| $Ca(Nb(OPr^i)_6)_2$ | 185° C. |
| $Ca(Ta(OPr^i)_6)_2$ | 185° C. |
| $Ca(Nb(OEt)_6)_2$ | 165° C. |
| $Ca(Ta(OEt)_6)_2$ | 155° C. |
| $Sr(Nb(OPr^i)_6)_2$ | 210° C. |
| $Sr(Ta(OPr^i)_6)_2$ | 220° C. |
| $Ba(Nb(OPr^i)_6)_2$ | 180° C. |
| $Ba(Ta(OPr^i)_6)_2$ | 210° C. |
| $NbAl(OPr^i)_8$ | 105° C. |
| $TaAl(OPr^i)_8$ | 105° C. |
| $NbAl_2(OPr^i)_{11}$ | 115° C. |
| $TaAl_2(OPr^i)_{11}$ | 120° C. |
| $Y[Al(OPr^i)_4]_3$ | 145° C. |
| $La[Al(OPr^i)_4]_3$ | 208° C. |
| $Ce[Al(OPr^i)_4]_3$ | 200° C. |
| $Pr[Al(OPr^i)_4]_3$ | 195° C. |
| $Pr[Ga(OPr^i)_4]_3$ | 123° C. |
| $Nd[Al(OPr^i)_4]_3$ | 190° C. |
| $Sm[Al(OPr^i)_4]_3$ | 203° C. |

Use of a metal complex with a greater number of cations than two as the precursor is also feasible.

EXAMPLE 3

Deposition of zirconium oxide onto an MgS:Cu layer using zirconium-2,2,6,6,-tetramethyl-3,5-heptanedionate and water as precursors Substrates having a copper-doped magnesium sulfide layer deposited on them (using either the ALE method or any other suitable deposition method) were heated to 440° C. in a reaction chamber maintained at 0.9 torr partial pressure of an inert gas. Zirconium-2,2,6,6,-tetramethyl-3,5-heptanedionate, shortly $Zr(TMHD)_2$, was heated in a source oven to 300° C. The evaporating precursor was pulsed into the reaction chamber alternately with water. Zirconium oxide was formed in the reaction between $Zr(TMHD)_4$ and water. The durations of the precursor pulses may be varied in the range 0.3–1.5 s. After each precursor pulse, a pause interval can be controlled during which the volatile reaction products are passed along with the inert gas purge flow to the pumps.

Zirconium oxide can also be deposited in the above-described manner using zirconium acetylacetonate $Zr(CH_3COCHCOCH_3)_4$, zirconium hexafluoracetylacetonate $Zr(CF_3COCHCOCF_3)_4$ or zirconium trifluoracetylacetonate $Zr(CF_3COCHCOCH_3)_4$ as precursors. With these, the operating temperature of the source oven is 170° C., 80° C. or 130° C., respectively.

Also hafnium or aluminum oxides can be deposited in the above manner, whereby hafnium-2,2,6,6,-tetramethyl-3,5-heptanedionate, shortly $Hf(TMHD)_4$, aluminum acetylacetonate $Al(CH_3COCHCOCH_3)_3$, aluminum hexafiuoracetylacetonate $Al(CF_3COCHCOCF_3)_3$ or aluminum-2,2,6,6,-tetramethyl-3,5-heptanedionate, shortly $Al(TMHD)_3$, are used as precursors. Then, the operating temperature of the source oven is 300° C., 180° C., 60° C. or 60° C., respectively.

Most metal oxides can be deposited in the above-described manner using β-diketonates of one or two metal cations as precursors.

In the deposition of oxides in the manner described in this example and in Example 1, water as the oxygen precursor can be replaced by methanol $CH_3OH$, ethanol $CH_3CH_2OH$, propanol $CH_3(CH_2)_2OH$, isopropanol $(CH_3)_2CHOH$, n-butanol $CH_3(CH_2)_3OH$, tertbutanol $(CH_3)_3CHOH$, glycerol $HOCH_2CH(OH)CH_2OH$, oxygen $O_2$, ozone $O_3$, hydrogen peroxide or nitrous oxide $N_2O$.

EXAMPLE 4

Division of an SrS:Ce phosphor into separate SrS:Ce layers by means of $Al_2O_3$ dielectric layers For comparison, EL structures were fabricated by the method described in Example 1 using $Al(OPr)_3$ as precursor so that the thickness of the SrS:Ce phosphor layer became 400–1200 nm (FIG. 3*a*). Alternatively, such structures were fabricated in which the SrS:Ce phosphor was divided into separate layers isolated from each other by $Al_2O_3$ dielectric layers. E.g., a triple-dielectric-layer structure (FIG. 3*b*) was formed in the following manner: The temperature of the substrates was controlled to 380° C. and the aluminum precursor source oven to 130° C. After the first SrS:Ce phosphor layer had reached a thickness of 500 nm, the source of the aluminum precursor ($Al(OPr)_3$) and the water source were pulsed alternately through 900 cycles. Thus an $Al_2O_3$ dielectric layer of 100 nm thickness was formed. The durations of the precursor and purging pulses were the same as in Example 1. Subsequent to the deposition of the aluminum oxide layer, an SrS:Ce layer of 500 nm thickness was deposited and then another 100 nm $Al_2O_3$ layer. Accordingly, a triple-dielectric-layer structure shown in FIG. 3*b* was obtained.

Luminance measurements on the different structures were performed through a blue filter at a predetermined operating voltage. A luminance of 2–4 $cd/m_2$ was measured from most structures, also when using a phosphor layer of 1200 nm thickness. By contrast, a triple-dielectric-layer structure in which the SrS:Ce phosphor layers were 500 nm thick and the $Al_2O_3$ layers were 100 nm thick exhibited a vastly better luminance in the range 6–9 $cd/m^2$. Thus the layer thicknesses used in the triple-dielectric-layer structure achieved a significant luminance improvement and as good luminance stability as a conventional dual-dielectric-layer structure. The structure disclosed herein would not have been practical by using, e.g., $AlCl_3$ as the precursor, because a rapid luminance decay results therefrom (FIG. 2).

We claim:

1. A method for preparing a planar multilayer structure, said method comprising depositing said multilayer structure comprising at least one phosphor layer and at least one dielectric layer onto a suitable substrate, said phosphor layer comprising at least one alkaline-earth metal sulfide and said dielectric layer comprising at least one metal oxide species, and depositing at least one of the dielectric layers by means of surface reactions directly onto said alkaline-earth sulfide layer, wherein the dielectric layer deposited onto said alkaline-earth sulfide layer is at least partially deposited from a precursor of vaporizable organometal complex containing at least one metal atom and at least one organic ligand bonded to said at least one metal atom via an oxygen atom, whereby an electroluminescent structure is achieved exhibiting a luminance better than 80% of an initial luminance value after 800 operating hours.

2. The method according to claim 1, wherein the dielectric layer is deposited onto the alkaline-earth sulfide layer from gas phase and the precursor for the metal oxide of the dielectric layer is an organometal complex having a composition of the general formula $ML_n$, where M is at least one metal of the metal oxide in the dielectric layer, L is an organic ligand bonded to the metal via an oxygen atom, and n is the coordination number 1–5 of the metal.

3. The method according to claim 1, in which method the dielectric layer is deposited onto the alkaline-earth sulfide layer from a gas phase, wherein the precursor for the metal oxide of the dielectric layer is a vaporizable organometal complex having a composition of the general formula $M(OR)_n$, where M is at least one metal of the metal oxide in the dielectric layer, and n is the coordination number 1–5 of the metal, and R is an alkyl group of 1–10 carbons.

4. The method according to claim 1 in which method the dielectric layer is deposited onto the alkaline-earth sulfide layer from gas phase, wherein the precursor for the metal oxide of the dielectric layer is a vaporizable organometal complex precursor having a composition of the general formula $ML_n$, where M is at least one metal of the metal oxide in the dielectric layer, and n is the coordination number 1–5 of the metal, and L is a β-diketonate residue.

5. The method according to claim 2, wherein the precursor used is an organometal complex having the composition of the general formula $M(C_5H_7O_2)_n$, where M is at least one metal of the metal oxide in the dielectric layer, and n is the coordination number 1–5 of the metal.

6. The method according to claim 2, wherein the precursor used is an organometal complex having the composition of the general formula $M(thd)_n$, where M is at least one metal of the metal oxide in the dielectric layer, and n is the coordination number 1–5 of the metal, and thd is a 2,2,6,6-tetramethyl-3,5-heptanedionate residue.

7. The method according to claim 1, wherein the dielectric layer is deposited at least partially using as the precursor an organometal complex containing at least two metal cations.

8. The method according to claim 1, wherein an organometal complex is used in which the metal M is Al, Ti, Y, Sm Si, Ta, Pb, Ba, Nb, Sr, Zr, Mn, Hf, La, Pr, Mg, Zn, Te, Sn, Th, W or Bi.

9. The method according to claim 1, wherein the dielectric layer is deposited at least partially from a precursor of an organometal complex by separating the metal oxide therefrom by means of an oxidant.

10. The method according to claim 9, wherein the oxidant used is water, hydrogen peroxide, alcohol, oxygen, ozone or nitrous oxide.

11. The method according to claim 1, wherein the dielectric layer is deposited at least partially from a precursor of an organometal complex by separating the metal oxide therefrom by means of thermal or light-induced decomposition.

12. The method according to claim 1, comprising preparing first a prefabricated substrate comprising a base substrate supporting the phosphor layer deposited thereon, and further depositing the multilayer structure on the prefabricated substrate.

13. The method according to claim 1, comprising preparing first a prefabricated substrate comprising a base substrate supporting the phosphor layer deposited thereon, and a metal oxide dielectric layer deposited thereon and further depositing the multilayer structure on the prefabricated substrate.

14. The method according to claim 1, comprising preparing first a prefabricated substrate comprising a base substrate supporting the multilayer structure comprising alternate phosphor layers and metal oxide dielectric layers deposited thereon, and further depositing on the prefabricated substrate the multilayer structure.

15. The method according to claim 1, wherein the at least one phosphor layer is deposited onto the dielectric layer last deposited, followed by a further deposition of a dielectric layer onto said phosphor layer(s).

16. The method according to claim 15, wherein a plurality of superimposed phosphor-dielectric layers are deposited onto the dielectric layer last deposited.

17. The method according to claim 1, comprising preparing the at least one phosphor layer containing a metal sulfide different from that/those of the other phosphor layers.

18. The method according to claim 17, comprising preparing the at least one phosphor layer containing ZnS.

19. The method according to claim 17, comprising preparing the at least one phosphor layer containing SrS.

20. The method according to claim 12, wherein two adjacent phosphor layers isolated by a metal oxide dielectric layer contain a sulfide of the same alkaline-earth metal.

21. The method according to claim 1, wherein the phosphor layer is doped with a suitable metal such as manganese, cerium, europium, terbium, thulium, praseodymium, samarium, erbium, tin, copper or lead.

22. The method according to claim 1, comprising preparing a phosphor layer containing a sulfide of Ca, Mg, Sr and/or Ba.

23. The method according to claim 1, comprising preparing at least the following layers in the mentioned order: a manganese-doped zinc sulfide layer, a cerium-doped strontium sulfide layer and a metal oxide layer.

24. The method according to claim 1, comprising preparing at least the following layers in the mentioned order: a manganese-doped zinc sulfide layer, a cerium-doped strontium sulfide layer, a metal oxide layer and a cerium-doped strontium sulfide layer.

25. The method according to claim 1, comprising preparing at least the following layers in the mentioned order: a cerium-doped strontium sulfide layer, a metal oxide layer and a manganese-doped zinc sulfide layer.

* * * * *